United States Patent
Chattopadhyay et al.

(10) Patent No.: US 11,223,469 B2
(45) Date of Patent: Jan. 11, 2022

(54) SYSTEM FOR SERIALIZING HIGH SPEED DATA SIGNALS

(71) Applicant: Synopsys, Inc., Mountain View, CA (US)

(72) Inventors: Biman Chattopadhyay, Karnataka (IN); Ravi Mehta, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/686,030

(22) Filed: Nov. 15, 2019

(65) Prior Publication Data

US 2020/0084016 A1 Mar. 12, 2020

Related U.S. Application Data

(63) Continuation of application No. 16/169,454, filed on Oct. 24, 2018, now Pat. No. 10,516,523, which is a
(Continued)

(30) Foreign Application Priority Data

Sep. 19, 2016 (IN) .............................. 201641031938

(51) Int. Cl.
*H04L 7/06* (2006.01)
*H04L 12/863* (2013.01)
(Continued)

(52) U.S. Cl.
CPC ................ *H04L 7/06* (2013.01); *H03M 9/00* (2013.01); *H04J 3/047* (2013.01); *H04J 3/0685* (2013.01); *H04L 47/6245* (2013.01)

(58) Field of Classification Search
CPC ........ H04L 7/06; H04L 47/6245; H03M 9/00; H04J 3/047; H04J 3/0685
(Continued)

(56) References Cited

U.S. PATENT DOCUMENTS 4,463,417 A  7/1984 Bushaw et al.
5,754,068 A  5/1998 Kumagai
(Continued)

OTHER PUBLICATIONS

United States Office Action, U.S. Appl. No. 15/349,193, filed Feb. 23, 2018, 32 pages.
(Continued)

*Primary Examiner* — Wednel Cadeau
(74) *Attorney, Agent, or Firm* — Fenwick & West LLP

(57) ABSTRACT

A system for serializing input data signals and generating an output data signal includes a FIFO memory that launches the input data signals at different phases of a clock signal. The system further includes multiple stages of a serializer circuit, and each stage of the serializer circuit receives a clock signal. Each successive stage includes half the number of serializer circuits that are included in the previous stage, and each successive stage is clocked by a clock signal that transitions at twice the frequency of the previous stage clock signal. The serializer circuits that belong to a single stage receive the clock signal with different phase. The phase and frequency of clock signals of serializer stages are adjusted such that a launched input data signal is outputted as the output data signal. Further, a critical path for each serializer circuit is equal to full clock cycle of the clock signal.

19 Claims, 5 Drawing Sheets

Related U.S. Application Data continuation of application No. 15/349,193, filed on Nov. 11, 2016, now Pat. No. 10,142,097.

(51) Int. Cl.
  *H03M 9/00* (2006.01)
  *H04J 3/04* (2006.01)
  *H04J 3/06* (2006.01)

(58) Field of Classification Search
  USPC .......................................................... 375/371
  See application file for complete search history.

(56) References Cited

U.S. PATENT DOCUMENTS

| | | | |
|---|---|---|---|
| 8,253,466 B2 * | 8/2012 | Jeffries | H03K 3/356113 |
| | | | 327/238 |
| 2001/0021051 A1 | 9/2001 | Kim | |
| 2003/0145258 A1 | 7/2003 | Warner et al. | |
| 2009/0182912 A1 | 7/2009 | Yoo et al. | |
| 2009/0222713 A1 * | 9/2009 | Shin | G06F 11/1004 |
| | | | 714/807 |
| 2010/0183108 A1 | 7/2010 | Shin | |
| 2010/0289677 A1 | 11/2010 | Choi | |
| 2011/0170560 A1 | 7/2011 | Kyles et al. | |
| 2016/0359645 A1 * | 12/2016 | Mukherjee | H04L 25/03057 |

OTHER PUBLICATIONS

United States Office Action, U.S. Appl. No. 15/349,193, filed Sep. 7, 2017, 23 pages.

Intellectual Property India, The Patent Office, First Examination Report, Indian Patent Application No. 201641031938, Jan. 14, 2020, six pages.

* cited by examiner

SYSTEM FOR SERIALIZING HIGH SPEED DATA SIGNALS

CROSS REFERENCE TO RELATED APPLICATIONS

This application is a continuation of U.S. patent application Ser. No. 16/169,454, filed Oct. 24, 2018, now U.S. Pat. No. 10,516,523, which is a continuation of U.S. patent application Ser. No. 15/349,193, filed Nov. 11, 2016, now U.S. Pat. No. 10,142,097, which claims priority to Indian Patent Application No. 201641031938, filed Sep. 19, 2016, each of which is incorporated by reference in its entirety.

FIELD

The present invention relates generally to integrated circuits, and, more particularly to a system for serializing and transmitting high speed data signals in the integrated circuits.

BACKGROUND

Typically, a wireline transmitter includes a digital circuit and a serializer circuit for providing an output data signal to a wireline. The digital circuit provides a parallel stream of input data signals to the serializer circuit. The serializer circuit converts the parallel stream of input data signals into a serial stream of output data signal and provides the serial stream of output data signal to the wireline. In one example, the digital circuit is a first-in-first-out (FIFO) memory that receives a clock signal and provides the parallel stream of input data signals when the clock signal is activated (also referred to as "launching the input data signals").

In one example, a 2:1 serializer circuit is used to serialize two input data signals. The 2:1 serializer circuit includes a multiplexer and a latch. The multiplexer has a first input terminal connected to the FIFO memory to receive a first input data signal, a second input terminal connected to the FIFO memory by way of the latch to receive a second input data signal, and a select terminal to receive the clock signal. The FIFO memory launches the first and second input data signals at the same time instance. When the clock signal is deactivated, the latch latches the second input data signal and the multiplexer outputs the first input data signal. After half cycle of the clock signal, when the clock signal is activated, the latch provides the latched second input data signal, and the multiplexer outputs the latched second input data signal, thereby serializing the first and second input data signals. The timing interval between launching of the first and second input data signals by the FIFO memory and receiving of the first and second input data signals by the multiplexer is also referred to as a "critical path". The critical path in the 2:1 serializer circuit is half cycle of the clock signal. Since, the FIFO memory launches the first and second input data signals at the same time instance, the 2:1 serializer circuit delays the second input data signal by half cycle of the clock signal to ensure that the first and second input data signals are outputted successively. Thus, the second input data signal is delayed to serialize the first and second input data signals. However, the delay of the second input data signal may introduce latency in the serializer circuit. Further, the multiplexer introduces additional delays due to set-up and hold time delays thereof because of which the critical path that is equal to half cycle of the clock signal is not sufficient to serialize high speed input data signals. Such a 2:1 serializer circuit provides incorrect input data signals. Moreover, a physical path between the FIFO memory and the 2:1 serializer circuit is large that further increases the time interval between outputting of the first and second input data signals by the FIFO memory, and receiving of the first and second input data signals by the 2:1 serializer circuit.

A known technique to overcome the aforementioned problems is to connect first and second flip-flops at the first and second input terminals of the multiplexer, respectively. The first and second flip-flops are placed in close proximity to the multiplexer. The first and second flip-flops receive the first and second input data signals, respectively, from the FIFO memory at the same time instance and launch the first and second input data signals, respectively, based on an external clock signal. Thus, the first and second flip-flops provide the first and second input data signals to the 2:1 serializer circuit based on the external clock signal. Since, the first and second flip-flops are placed in close proximity to the multiplexer, the time interval between outputting of the first and second input data signals by the first and second flip-flops, respectively, and receiving of the first and second input data signals by the serializer circuit is reduced. However, the first and second flip-flops introduce latency in the 2:1 serializer circuit which is undesirable. Further, as the first and second input data signals are launched at the same time instance, the critical path in such a 2:1 serializer circuit is half cycle of the external clock signal. Thus, for serializing high speed input data signals, the critical path is not sufficient.

Therefore, it would be advantageous to have an N:1 serializer circuit that has reduced latency in outputting launched input data signals, and that overcomes the aforementioned drawbacks of the existing serializer circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

Figure 1:
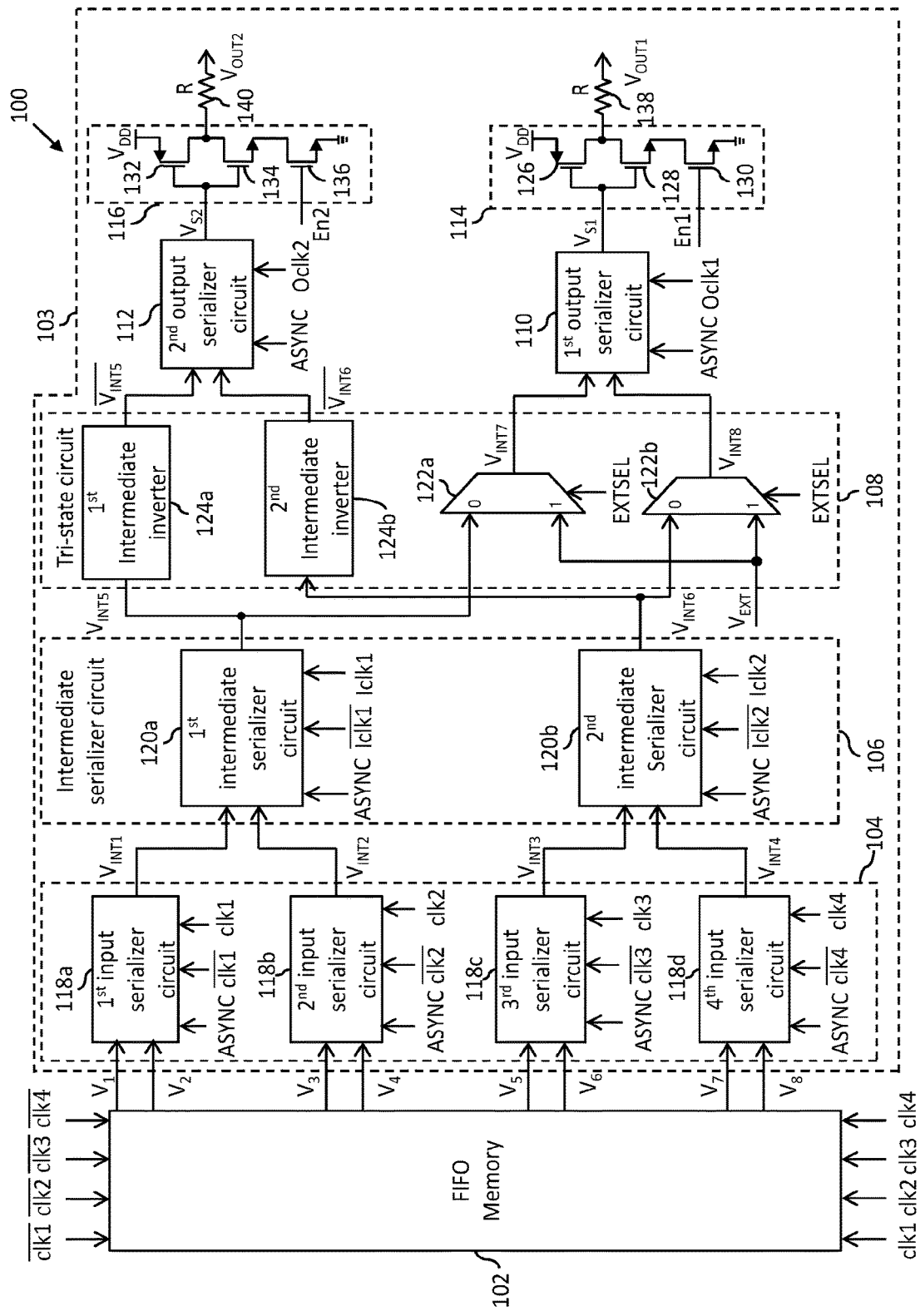
FIG. 1 is a schematic circuit diagram of a system for serializing input data signals in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present.

In an embodiment of the present invention, a system for serializing a plurality of intermediate signals including first through fourth intermediate signals is provided. The system includes first and second intermediate serializer circuits, a tri-state circuit, and a first output serializer circuit. The first intermediate serializer circuit receives a first intermediate clock signal and the first and second intermediate signals, and generates a fifth intermediate signal. The first intermediate serializer circuit receives the first intermediate signal and provides the first intermediate signal as the fifth intermediate signal when the first intermediate clock signal is deactivated. The first intermediate serializer circuit receives the second intermediate signal and provides the second intermediate signal as the fifth intermediate signal when the first intermediate clock signal is activated, thereby serializing the first and second intermediate signals. The second intermediate serializer circuit receives a second intermediate clock signal and the third and fourth intermediate signals, and generates a sixth intermediate signal. The first and second intermediate clock signals have a first predetermined phase difference between them. The second intermediate serializer circuit receives the third intermediate signal and provides the third intermediate signal as the sixth intermediate signal when the second intermediate clock signal is deactivated. The second intermediate serializer circuit receives the fourth intermediate signal and provides the fourth intermediate signal as the sixth intermediate signal when the second intermediate clock signal is activated, thereby serializing the third and fourth intermediate signals. The tri-state circuit receives an external signal, an external select signal, the fifth and sixth intermediate signals, and generates seventh and eighth intermediate signals. The tri-state circuit provides the fifth and sixth intermediate signals as the seventh and eighth intermediate signals, respectively, when the external select signal is at a first logic state, and provides the external signal as the seventh and eighth intermediate signals when the external select signal is at a second logic state. The first output serializer circuit receives the seventh and eighth intermediate signals and a first output clock signal, and generates a first serialized signal. Each of the first and second intermediate clock signals has a frequency equal to half a frequency of the first output clock signal. The first output serializer circuit provides the seventh intermediate signal as the first serialized signal when the first output clock signal is deactivated, and provides the eighth intermediate signal as the first serialized signal when the first output clock signal is activated, thereby serializing the first through fourth intermediate signals.

In another embodiment of the present invention, a system for serializing a plurality of input data signals is provided. The system includes an input serializer circuit, an intermediate serializer circuit, a tri-state circuit, and a first output serializer circuit. The input serializer circuit receives the plurality of input data signals including first through eighth input data signals and first through fourth input clock signals, and generates first through fourth intermediate signals. The first and second input clock signals have a first predetermined phase difference between them, and the third and fourth input clock signals have the first predetermined phase difference between them. The first and third input clock signals have a second predetermined phase difference between them, and the second and fourth input clock signals have the second predetermined phase difference between them. The input serializer circuit receives the first, third, fifth, and seventh input data signals and provides the first, third, fifth, and seventh input data signals as the first through fourth intermediate signals when the first through fourth input clock signals are deactivated, respectively. The input serializer circuit receives the second, fourth, sixth, and eighth input data signals and provides the second, fourth, sixth, and eighth input data signals as the first through fourth intermediate signals when the first through fourth input clock signals are activated, respectively. The intermediate serializer circuit for receives the first through fourth intermediate signals and first and second intermediate clock signals, and generates fifth and sixth intermediate signals. The first and second intermediate clock signals have the first predetermined phase difference between them. The intermediate serializer circuit provides the first and third intermediate signals as the fifth and sixth intermediate signals when the first and second intermediate clock signals are deactivated, respectively. The intermediate serializer circuit provides the second and fourth intermediate signals as the fifth and sixth intermediate signals when the first and second intermediate clock signals are activated, respectively. The tri-state circuit receives an external signal, an external select signal, and the fifth and sixth intermediate signals, and generates seventh and eighth intermediate signals. The tri-state circuit provides the fifth and sixth intermediate signals as the seventh and eighth intermediate signals, respectively when the external select signal is at a first logic state, and provides the external signal as the seventh and eighth intermediate signals when the external select signal is at a second logic state. The first output serializer circuit receives the seventh and eighth intermediate signals and a first output clock signal, and generates a first serialized signal. Each of the first and second intermediate clock signals has a frequency equal to half a frequency of the first output clock signal, and each of the first through fourth input clock signals has a frequency equal to half the frequency of the first intermediate clock signal. The first output serializer circuit provides the seventh intermediate signal as the first serialized signal when the first output clock signal is deactivated, and provides the eighth intermediate signal as the first serialized signal when the first output clock signal is activated, thereby serializing the first through eighth input data signals.

Various embodiments of the present invention provide a system for serializing a plurality of intermediate signals including first through fourth intermediate signals. The system includes a first intermediate serializer circuit that receives a first intermediate clock signal and the first and second intermediate signals, and generates a fifth intermediate signal. The first intermediate serializer circuit provides the first intermediate signal as the fifth intermediate signal when the first intermediate clock signal is deactivated, and provides the second intermediate signal as the fifth intermediate signal when the first intermediate clock signal is activated, thereby serializing the first and second intermediate signals. The system further includes a second intermediate serializer circuit that receives a second intermediate clock signal and the third and fourth intermediate signals, and generates a sixth intermediate signal. The first and second intermediate clock signals have a first predetermined phase difference between them that ensures the critical path of the first and second intermediate serializer circuits to be equal to full cycle of the first and second intermediate clock signals, respectively. The tri-state circuit receives the fifth and sixth intermediate signals, an external select signal, an external signal, and generates inverted fifth and sixth intermediate signals and seventh and eighth intermediate signals. The inverted fifth and sixth intermediate signals are used to incorporate differential signaling. The system further includes a first output serializer circuit that receives the seventh and eighth intermediate signals and a first output clock signal, and generates a first serialized signal. The first output serializer circuit provides the seventh intermediate signal as the first serialized signal when the first output clock signal is deactivated, and provides the eighth intermediate signal as the first serialized signal when the first output clock signal is activated, thereby serializing the first through fourth intermediate signals. The system further includes a second output serializer circuit that receives the inverted fifth and sixth intermediate signals and a second output clock signal, and generates a second serialized signal. Since, the second output serializer circuit receives the inverted fifth and sixth intermediate signals, the second serialized signal is an inverted version of the first serialized signal.

In synchronous mode of operation, the system receives the first and second intermediate clock signals, and the first and second output clock signals to serialize the first through fourth intermediate signals. In an asynchronous mode of operation, the system does not receive the aforementioned clock signals. However, in an absence of the aforementioned clock signals, the first and second intermediate serializer circuits and the first and second output serializer circuits utilize the asynchronous enable signal as the clock signals for serializing the first through fourth intermediate signals. Further, the system is operable in a tri-state mode of operation when the first enable signal is deactivated. The tri-state circuit activates the external select signal and adjusts the external signal such that the first and second serialized signals are at a high logic state. Thus, the system can be utilized for synchronous, asynchronous, and tri-state modes of operation.

The system further includes a FIFO memory that receives the first and second intermediate clock signals, and provides the first through fourth intermediate signals based on the first and second intermediate clock signals. Since, the first and second intermediate clock signals have equal frequencies but different phases, the FIFO memory outputs the first through fourth intermediate signals in a predefined sequence based on the first and second intermediate clock signals. The input serializer circuit receives the first through fourth intermediate signals from the FIFO memory and outputs an intermediate signal that is provided by the FIFO memory. Further, each serializer circuit receives two input data signals that have a phase difference of 180 degrees and none of the two input signals is delayed to serialize the two input signals, thereby ensuring that a critical path of the serializer circuit is equal to full clock cycle of the clock signal. Thus, for serializing high speed input data signals each serializer circuit receives the input data signals for a sufficient time period. Such a serializer circuit provides a correct measure of the input data signals.

Referring now to FIG. 1, a schematic circuit diagram of a system 100 in accordance with an embodiment of the present invention is shown. Generally, the system 100 is a wireline transmitter that converts a parallel stream of digital input data into a serial stream of output data and transmits the serial stream of output data. The system 100 includes a digital circuit such as a random-access memory (RAM) or FIFO memory that provides the parallel stream of digital input data. The system 100 transmits the stream of serial output data to a wireline (not shown) for further transmission.

The system 100 includes a FIFO memory 102 and a serializer circuit 103. The serializer circuit 103 includes an input serializer circuit 104, an intermediate serializer circuit 106, a tri-state circuit 108, first and second output serializer circuits 110 and 112, and first and second driver circuits 114 and 116. The FIFO memory 102 stores the data to be serialized. The FIFO memory 102 receives first through fourth input clock signals (clk1-clk4) and inverted first through fourth input clock signals ($\overline{\text{clk1}}$-$\overline{\text{clk4}}$) and outputs first through eighth input data signals ($V_1$-$V_8$). In one embodiment, the first through fourth input clock signals (clk1-clk4) and the inverted first through fourth input clock signals ($\overline{\text{clk1}}$-$\overline{\text{clk4}}$) are generated by a clock generator (not shown).

The first and second input clock signals (clk1 and clk2), and the third and fourth input clock signals (clk3 and clk4) each have a first predetermined phase difference between them. The first and third input clock signals have a second predetermined phase difference between them, and the second and fourth input clock signals have the second predetermined phase difference between them. In the presently preferred embodiment, the first predetermined phase difference is 90 degrees and the second predetermined phase difference is 45 degrees. The FIFO memory 102 is connected to the clock generator for receiving the first through fourth input clock signals (clk1-clk4) and the inverted first through fourth input clock signals ($\overline{\text{clk1}}$-$\overline{\text{clk4}}$). The FIFO memory 102 outputs the first, third, fifth, and seventh input data signals ($V_1$, $V_3$, $V_5$, and $V_7$) when the inverted first through fourth input clock signals ($\overline{\text{clk1}}$-$\overline{\text{clk4}}$) are activated, respectively. The FIFO memory 102 outputs the second, fourth, sixth, and eighth input data signals ($V_2$, $V_4$, $V_6$, and $V_8$) when the first through fourth input clock signals (clk1-clk4) are activated, respectively. It will be understood by those skilled in the art that the first through eighth input data signals ($V_1$-$V_8$) may be provided by any other digital circuit and is not restricted to the use of the FIFO memory 102.

The input serializer circuit 104 receives the first through eighth input data signals ($V_1$-$V_8$), the first through fourth input clock signals (clk1-clk4), and the inverted first through fourth input clock signals ($\overline{\text{clk1}}$-$\overline{\text{clk4}}$), and generates first through fourth intermediate signals ($V_{INT1}$-$V_{INT4}$). The input serializer circuit 104 outputs the first, third, fifth, and seventh input data signals ($V_1$, $V_3$, $V_5$, and $V_7$) as the first through fourth intermediate signals ($V_{INT1}$-$V_{INT4}$) when the inverted first through fourth input clock signals ($\overline{\text{clk1}}$-$\overline{\text{clk4}}$) are activated, respectively. The input serializer circuit 104 outputs the second, fourth, sixth, and eighth input data signals ($V_2$, $V_4$, $V_6$, and $V_8$) as the first through fourth intermediate signals ($V_{INT1}$-$V_{INT4}$) when the first through fourth input clock signals (clk1-clk4) are activated, respectively.

The input serializer circuit 104 includes first through fourth input serializer circuits 118a-118d. The first input serializer circuit 118a is connected to the FIFO memory 102 to receive the first and second input data signals ($V_1$ and $V_2$). The first input serializer circuit 118a further receives the first input clock signal (clk1) and the inverted first input clock signal ($\overline{\text{clk1}}$) and generates the first intermediate signal ($V_{INT1}$). The first input serializer circuit 118a provides the first input data signal ($V_1$) as the first intermediate signal ($V_{INT1}$) when the inverted first input clock signal ($\overline{\text{clk1}}$) is activated, and the second input data signal ($V_2$) as the first intermediate signal ($V_{INT1}$) when the first input clock signal (clk1) is activated, thereby serializing the first and second input data signals ($V_1$ and $V_2$).

The second input serializer circuit 118b is connected to the FIFO memory 102 to receive the third and fourth input data signals ($V_3$ and $V_4$). The second input serializer circuit 118b further receives the second input clock signal (clk2) and the inverted second input clock signal ($\overline{\text{clk2}}$), and generates the second intermediate signal ($V_{INT2}$). The second input serializer circuit 118*b* provides the third input data signal ($V_3$) as the second intermediate signal ($V_{INT2}$) when the inverted second input clock signal ($\overline{clk2}$) is activated, and the fourth input data signal ($V_4$) as the second intermediate signal ($V_{INT2}$) when the second input clock signal (clk2) is activated, thereby serializing the third and fourth input data signals ($V_3$ and $V_4$).

The third input serializer circuit 118*c* is connected to the FIFO memory 102 for receiving the fifth and sixth input data signals ($V_5$ and $V_6$). The third input serializer circuit 118*c* further receives the third input clock signal (clk3) and the inverted third input clock signal (clk3), and generates the third intermediate signal ($V_{INT3}$). The third input serializer circuit 118*c* provides the fifth input data signal ($V_5$) as the third intermediate signal ($V_{INT3}$) when the inverted third input clock signal ($\overline{clk3}$) is activated, and the sixth input data signal ($V_6$) as the third intermediate signal ($V_{INT3}$) when the third input clock signal (clk3) is activated, thereby serializing the fifth and sixth input data signals ($V_5$ and $V_6$).

The fourth input serializer circuit 118*d* is connected to the FIFO memory 102 for receiving the seventh and eighth input data signals ($V_7$ and $V_8$). The fourth input serializer circuit 118*d* further receives the fourth input clock signal (clk4) and the inverted fourth input clock signal ($\overline{clk4}$), and generates the fourth intermediate signal ($V_{INT4}$). The fourth input serializer circuit 118*d* provides the seventh input data signal ($V_7$) as the fourth intermediate signal ($V_{INT4}$) when the inverted fourth input clock signal ($\overline{clk4}$) is activated, and the eighth input data signal ($V_8$) as the fourth intermediate signal ($V_{INT4}$) when the fourth input clock signal (clk4) is activated, thereby serializing the seventh and eighth input data signals ($V_7$ and $V_8$).

The intermediate serializer circuit 106 receives first and second intermediate clock signals (Iclk1 and Iclk2) and inverted first and second intermediate clock signals ($\overline{Iclk1}$-$\overline{Iclk2}$). The first and second intermediate clock signals (Iclk1 and Iclk2) are generated by the clock generator. The first and second intermediate clock signals (Iclk1 and Iclk2) have the first predetermined phase difference between them. Further, the intermediate serializer circuit 106 is connected to the input serializer circuit 104 for receiving the first through fourth intermediate signals ($V_{INT1}$-$V_{INT4}$) and generating fifth and sixth intermediate signals ($V_{INT5}$ and $V_{INT6}$). The input serializer circuit 104 provides the first and third intermediate signals ($V_{INT1}$ and $V_{INT3}$) as the fifth and sixth intermediate signals ($V_{INT5}$ and $V_{INT6}$) when the inverted first and second intermediate clock signals ($\overline{Iclk1}$ and $\overline{Iclk2}$) are activated, respectively. The input serializer circuit 104 provides the second and fourth intermediate signals ($V_{INT2}$ and $V_{INT4}$) as the fifth and sixth intermediate signals ($V_{INT5}$ and $V_{INT6}$) when the first and second intermediate clock signals (Iclk1 and Iclk2) are activated, respectively.

The intermediate serializer circuit 106 includes first and second intermediate serializer circuits 120*a* and 120*b*. The first intermediate serializer circuit 120*a* is connected to the first and second input serializer circuits 118*a* and 118*b* for receiving the first and second intermediate signals ($V_{INT1}$ and $V_{INT2}$), respectively. The first intermediate serializer circuit 120*a* further receives the first intermediate clock signal (Iclk1), and generates the fifth intermediate signal ($V_{INT5}$). The first intermediate serializer circuit 120*a* provides the first intermediate signal ($V_{INT1}$) as the fifth intermediate signal ($V_{INT5}$) when the inverted first intermediate clock signal ($\overline{Iclk1}$) is activated, and the second intermediate signal ($V_{INT2}$) as the fifth intermediate signal ($V_{INT5}$) when the first intermediate clock signal (Iclk1) is activated, thereby serializing the first and second intermediate signals ($V_{INT1}$ and $V_{INT2}$).

The second intermediate serializer circuit 120*b* is connected to the third and fourth input serializer circuits 118*c* and 118*d* for receiving the third and fourth intermediate signals ($V_{INT3}$ and $V_{INT4}$), respectively. The second intermediate serializer circuit 120*b* further receives the second intermediate clock signal (Iclk2), and generates the sixth intermediate signal ($V_{INT6}$). The second intermediate serializer circuit 120*b* provides the third intermediate signal ($V_{INT3}$) as the sixth intermediate signal ($V_{INT6}$) when the inverted second intermediate clock signal ($\overline{Iclk2}$) is activated, and the fourth intermediate signal ($V_{INT4}$) as the sixth intermediate signal ($V_{INT6}$) when the second intermediate clock signal (Iclk2) is activated, thereby serializing the third and fourth intermediate signals ($V_{INT3}$ and $V_{INT4}$).

The tri-state circuit 108 is connected to the intermediate serializer circuit 106 for receiving the fifth and sixth intermediate signals ($V_{INT5}$ and $V_{INT6}$). The tri-state circuit 108 further receives an external signal ($V_{EXT}$) and an external select signal (EXTSEL), and generates inverted fifth and sixth intermediate signals ($\overline{V_{INT5}}$ and $\overline{V_{INT6}}$) and seventh and eighth intermediate signals ($V_{INT7}$ and $V_{INT8}$). The tri-state circuit 108 provides the inverted fifth and sixth intermediate signals ($\overline{V_{INT5}}$ and $\overline{V_{INT6}}$) to implement the technique of differential signaling.

The tri-state circuit 108 includes first and second multiplexers 122*a* and 122*b* and first and second intermediate inverters 124*a* and 124*b*. The first multiplexer 122*a* has a first input terminal connected to the first intermediate serializer circuit 120*a* for receiving the fifth intermediate signal ($V_{INT5}$), a second input terminal for receiving the external signal ($V_{EXT}$), and a select terminal for receiving the external select signal (EXTSEL). The first multiplexer 122*a* further has an output terminal for outputting the seventh intermediate signal ($V_{INT7}$). The first multiplexer 122*a* outputs the fifth intermediate signal ($V_{INT5}$) as the seventh intermediate signal ($V_{INT7}$) when the external select signal (EXTSEL) is at a first logic state. The first multiplexer 122*a* outputs the external signal ($V_{EXT}$) as the seventh intermediate signal ($V_{INT7}$) when the external select signal (EXTSEL) is at a second logic state. In presently preferred embodiment, the first logic state is a logic low state and the second logic state is a logic high state.

The second multiplexer 122*b* has a first input terminal connected to the second intermediate serializer circuit 120*b* for receiving the sixth intermediate signal ($V_{INT6}$), a second input terminal for receiving the external signal ($V_{EXT}$), and a select terminal for receiving the external select signal (EXTSEL). The second multiplexer 122*b* further has an output terminal for outputting the eighth intermediate signal ($V_{INT8}$). The second multiplexer 122*b* outputs the sixth intermediate signal ($V_{INT6}$) as the eighth intermediate signal ($V_{INT8}$) when the external select signal (EXTSEL) is at the first logic state. The second multiplexer 122*b* outputs the external signal ($V_{EXT}$) as the eighth intermediate signal ($V_{INT8}$) when the external select signal (EXTSEL) is at the second logic state.

The first intermediate inverter 124*a* is connected to the first intermediate serializer circuit 120*a* for receiving the fifth intermediate signal ($V_{INT5}$) and generating the inverted fifth intermediate signal ($\overline{V_{INT5}}$). The second intermediate inverter 124*b* is connected to the second intermediate serializer circuit 120*b* for receiving the sixth intermediate signal ($V_{INT6}$) and generating the inverted sixth intermediate signal ($\overline{V_{INT6}}$).

The first output serializer circuit 110 is connected to the tri-state circuit 108 for receiving the seventh and eighth intermediate signals ($V_{INT7}$ and $V_{INT8}$). The first output serializer circuit 110 further receives a first output clock signal (Oclk1) and generates a first serialized signal ($V_{S1}$). The first output serializer circuit 110 provides the seventh intermediate signal ($V_{INT7}$) as the first serialized signal ($V_{S1}$) when the first output clock signal (Oclk1) is deactivated and the eighth intermediate signal ($V_{INT8}$) as the first serialized signal ($V_{S1}$) when the first output clock signal (Oclk1) is activated, thereby serializing the seventh and eighth intermediate signals ($V_{INT7}$ and $V_{INT8}$).

The second output serializer circuit 112 is connected to the tri-state circuit 108 for receiving the inverted fifth and sixth intermediate signals ($\overline{V_{INT5}}$ and $\overline{V_{INT6}}$). The second output serializer circuit 112 further receives a second output clock signal (Oclk2) and generates a second serialized signal ($V_{S2}$). The second output serializer circuit 112 provides the inverted fifth intermediate signal ($\overline{V_{INT5}}$) as the second serialized signal ($V_{S2}$) when the second output clock signal (Oclk2) is deactivated and the inverted sixth intermediate signal ($\overline{V_{INT6}}$) as the second serialized signal ($V_{S2}$) when the second output clock signal (Oclk2) is activated, thereby serializing the inverted fifth and sixth intermediate signals ($\overline{V_{INT5}}$ and $\overline{V_{INT6}}$). Each of the first through fourth input serializer circuits 118a-118d, the first and second intermediate serializer circuits 120a and 120b, and the first and second output serializer circuits 110 and 112 receive an asynchronous enable signal (ASYNC). The system 100 utilizes the asynchronous enable signal (ASYNC) in the absence of clock signals (i.e. the first through fourth input clock signals (clk1-clk4), the inverted first through fourth input clock signals ($\overline{clk1}$ and $\overline{clk4}$), the first and second intermediate clock signals (Iclk1 and Iclk2), the inverted first and second intermediate clock signals ($\overline{Iclk1}$ and $\overline{Iclk2}$), the first and second output clock signals (Oclk1 and Oclk2)) during an asynchronous mode of operation of the system 100.

The first driver circuit 114 receives a first enable signal (En1), and is connected to the first output serializer circuit 110 for receiving the first serialized signal ($V_{S1}$). The first driver circuit 114 outputs the first serialized signal ($V_{S1}$) as a first output data signal ($V_{OUT1}$) when the first enable signal (En1) is activated. The first driver circuit 114 outputs the first output data signal ($V_{OUT1}$) at a high impedance state when the first enable signal (En1) is deactivated.

The first driver circuit 114 includes first through third driver transistors 126, 128, and 130. The first driver circuit 114 is connected to a first resistor 138 which is a load resistor. The first driver transistor 126 has a source terminal connected to a supply voltage ($V_{DD}$) and a gate terminal connected to the first output serializer circuit 110 for receiving the first serialized signal ($V_{S1}$). The second driver transistor 128 has a gate terminal connected to the gate terminal of the first driver transistor 126, and a drain terminal connected to a drain terminal of the first driver transistor 126 for outputting the first output data signal ($V_{OUT1}$). The third driver transistor 130 has a drain terminal connected to a source terminal of the second driver transistor 128, a gate terminal to receive the first enable signal (En1), and a source terminal connected to ground.

The second driver circuit 116 receives a second enable signal (En2), and is connected to the second output serializer circuit 112 for receiving the second serialized signal ($V_{S2}$). The second driver circuit 116 outputs the second serialized signal ($V_{S2}$) as a second output data signal ($V_{OUT2}$) when the second enable signal (En2) is activated and the second output data signal ($V_{OUT2}$) is at a high impedance state when the second enable signal (En2) is deactivated. The second output data signal ($V_{OUT2}$) is an inverted version of the first output data signal ($V_{OUT1}$).

The second driver circuit 116 includes fourth through sixth driver transistors 132, 134, and 136. The second driver circuit 116 is connected to a second resistor 140 which is a load resistor. The fourth driver transistor 132 has a source terminal connected to a supply voltage ($V_{DD}$) and a gate terminal connected to the second output serializer circuit 112 for receiving the second serialized signal ($V_{S2}$). The fifth driver transistor 134 has a gate terminal connected to the gate terminal of the fourth driver transistor 132, and a drain terminal connected to a drain terminal of the fourth driver transistor 132 for outputting the second output data signal ($V_{OUT2}$). The sixth driver transistor 136 has a drain terminal connected to a source terminal of the fifth driver transistor 134, a gate terminal to receive the second enable signal (En2), and a source terminal connected to ground.

In one embodiment, the system 100 includes multiple serializer circuits 103. The serializer circuits share a first data bus to output corresponding first output data signals and a second data bus to output corresponding second output data signals. The serializer circuits each are connected to the FIFO memory 102 to receive the first through eighth input data signals. Each serializer circuit 103 receives the first through eighth input data signals ($V_1$-$V_8$) based on corresponding first through fourth input clock signals, and outputs corresponding first and second output data signals. In one embodiment, the first through fourth input clock signals of each serializer circuit are activated at the same time instance. Thus, the corresponding first and second output data signals provided by each serializer circuit 103 are equal, thereby providing maximum drive strength. In another embodiment, the first through fourth input clock signals of a first set of serializer circuits are activated after a predetermined time instance from the activation of the first through fourth input clock signals of a second set of serializer circuits. Further, the first set of serializer circuits receives the first through eighth input data signals ($V_1$-$V_8$) and the second set of serializer circuits receives inverted first through eighth input data signals ($\overline{V_1}$-$\overline{V_8}$). Thus, the first and second output data signals of each serializer circuit 103 of the second set of serializer circuits are inverted and phase shifted versions of the first and second output data signals of each serializer circuit 103 of the first set of serializer circuits, thereby providing feed-forward equalization. One such feed-forward equalization is de-emphasis in which the first and second output data signals with data transition are of full-swing and the first and second output data signals with no transition are low-swing.

The system 100 operates in a tri-state mode when the first and second enable signals (En1 and En2) are deactivated, the external select signal (EXTSEL) is activated, and the external signal ($V_{EXT}$) is equal to the fifth intermediate signal ($V_{INT5}$). During the tri-state mode of operation, the first and second output data signals ($V_{OUT1}$ and $V_{OUT2}$) of the serializer circuit 103 are at a high impedance state. In one embodiment, first and second driver circuits of each of the serializer circuit of the first set of serializer circuits are activated by activating corresponding first and second enable signals (En1 and En2) of the first set of driver circuits. First and second driver circuits of each of the serializer circuit of the second set of serializer circuits are deactivated by deactivating corresponding first and second enable signals (En1 and En2) of the second set of driver circuits. Thus, the system 100 varies the drive strength of resultant first and second output data signals and the looking-in impedance of the system 100 by activating or deactivating the first and second driver circuits, thereby providing an alternate method to alter the swing of the resultant first output data signal which is a combination of the first output data signals of the first and second sets of the serializer circuits and the swing of the resultant second output data signal which is a combination of the second output data signals of the first and second sets of the serializer circuits.

Figure 2:
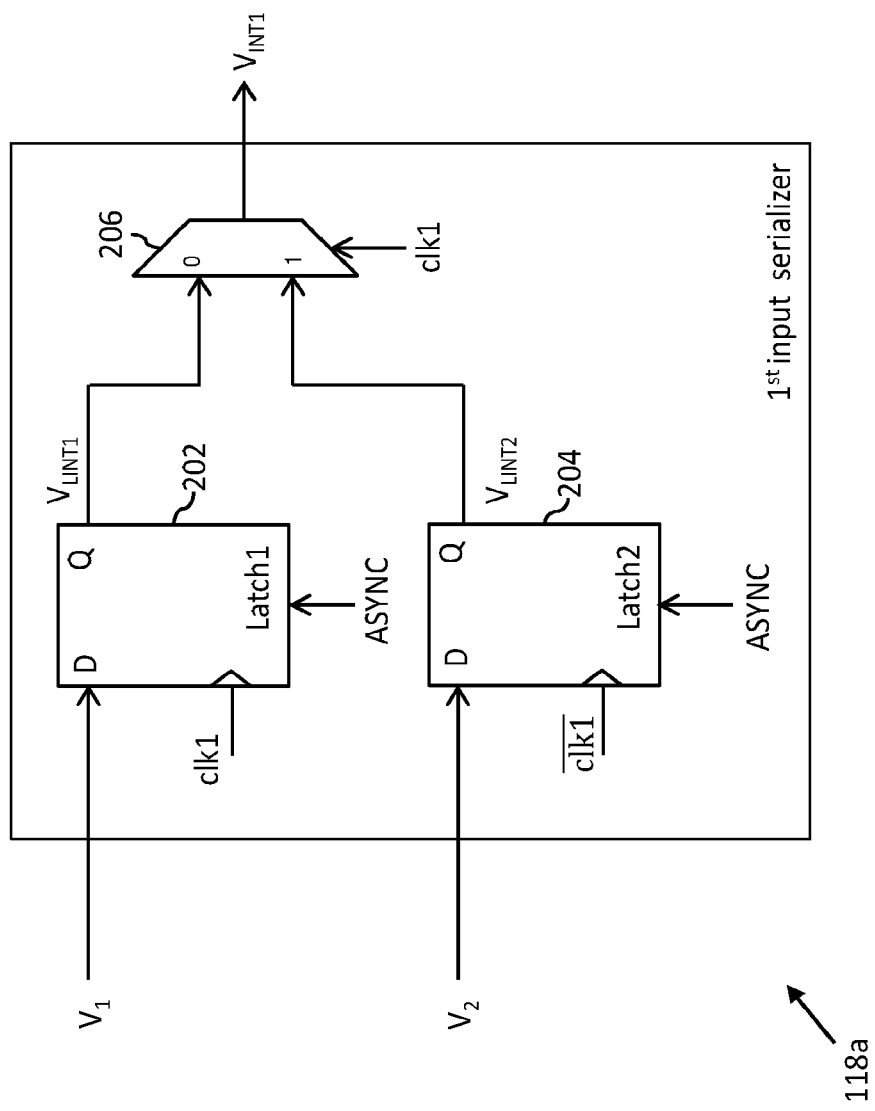
FIG. 2 is a schematic circuit diagram of a serializer circuit used in the system of FIG. 1 in accordance with an embodiment of the present invention.

Referring now to FIG. 2, a schematic circuit diagram of the first input serializer circuit 118a of the system 100 of FIG. 1 in accordance with an embodiment of the present invention is shown. The second through fourth input serializer circuits 118b-118d, the first and second intermediate serializer circuits 120a and 120b, and the first and second output serializer circuits 110 and 112 are structurally and functionally similar to the first input serializer circuit 118a. The first input serializer circuit 118a includes first and second latches 202 and 204, and a third multiplexer 206.

The first latch 202 has an input terminal connected to the FIFO memory 102 for receiving and latching the first input data signal ($V_1$). The first latch 202 further has a clock input terminal for receiving the first input clock signal (clk1) and an output terminal for outputting a first latched intermediate signal ($V_{LINT1}$). The first latch 202 latches the first input data signal ($V_1$) when the first input clock signal (clk1) is activated, and outputs the latched first input data signal ($V_1$) as the first latched intermediate signal ($V_{LINT1}$) when the first input clock signal (clk1) is deactivated.

The second latch 204 has an input terminal connected to the FIFO memory 102 for receiving and latching the second input data signal ($V_2$). The second latch 204 further has a clock input terminal for receiving the inverted first input clock signal ($\overline{clk1}$) and an output terminal for outputting a second latched intermediate signal ($V_{LINT2}$). The second latch 204 latches the second input data signal ($V_2$) when the inverted first input clock signal ($\overline{clk1}$) is activated, and outputs the latched second input data signal ($V_2$) as the second latched intermediate signal ($V_{LINT2}$) when the inverted first input clock signal ($\overline{clk1}$) is deactivated. In presently preferred embodiment, the first and second latches 202 and 204 are true single phase clock latches.

Further, each of the first and second latches 202 and 204 receives the asynchronous enable signal (ASYNC). In an asynchronous mode of operation of the system 100, the first and second latches 202 and 204 output the first and second latched intermediate signals ($V_{LINT1}$ and $V_{LINT2}$), respectively, irrespective of a logic state the first input clock signal (clk1). Thus, in the absence of the first through fourth input clock signals (clk1-clk4), the first and second intermediate clock signals (Iclk1 and Iclk2), and the first and second output clock signals (Oclk1 and Oclk2), when the asynchronous enable signal (ASYNC) is activated, the first and second latches 202 and 204 output the first and second input data signals ($V_1$ and $V_2$), respectively, without latching the respective input data signals. Thus, the first input serializer circuit 118a outputs at least one of the first and second input data signals ($V_1$ and $V_2$) as the first intermediate signal ($V_{INT1}$) when at least one of the first input clock signal (clk1), the inverted first input clock signal ($\overline{clk1}$), and the asynchronous enable signal (ASYNC) are activated.

The third multiplexer 206 has a first input terminal connected to the output terminal of the first latch 202 for receiving the first latched intermediate signal ($V_{LINT1}$), a second input terminal connected to the output terminal of the second latch 204 for receiving the second latched intermediate signal ($V_{LINT2}$), and a select terminal for receiving the first input clock signal (clk1). The third multiplexer 206 further has an output terminal for outputting the first intermediate signal ($V_{INT1}$). The third multiplexer 206 outputs the first latched intermediate signal ($V_{LINT1}$) as the first intermediate signal ($V_{INT1}$) when the first input clock signal (clk1) is deactivated and the second latched intermediate signal ($V_{LINT2}$) as the first intermediate signal ($V_{INT1}$) when the first input clock signal (clk1) is activated.

Figure 3:
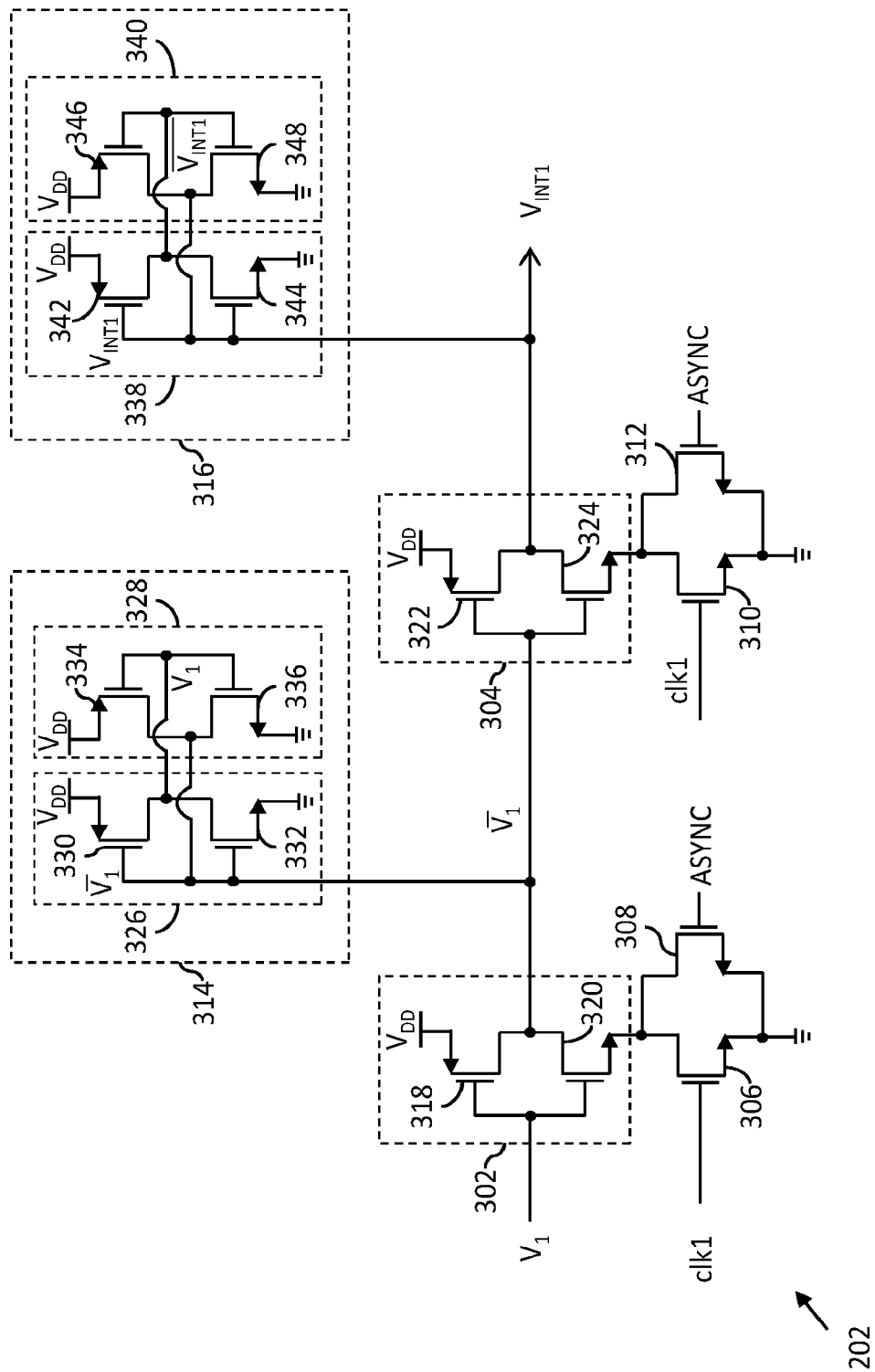
FIG. 3 is a schematic circuit diagram of a true single phase clock latch used in the serializer circuit of FIG. 2 in accordance with an embodiment of the present invention.

Referring now to FIG. 3, a schematic circuit diagram of the first latch 202 of FIG. 2 in accordance with an embodiment of the present invention is shown. The second latch 204 is structurally and functionally similar to the first latch 202. The first latch 202 includes first and second intermediate driver circuits 302 and 304, first through fourth transistors 306-312, and first and second cross-coupled latch circuits 314 and 316. The first intermediate driver circuit 302 includes first and second intermediate transistors 318 and 320. The second intermediate driver circuit 304 includes third and fourth intermediate transistors 322 and 324.

The first intermediate driver circuit 302 has an input terminal connected to the FIFO memory 102 for receiving the first input data signal ($V_1$), an output terminal for generating an inverted first input data signal ($\overline{V_1}$). The first intermediate transistor 318 has a source terminal connected to the supply voltage ($V_{DD}$) and a gate terminal connected to the FIFO memory 102 for receiving the first input data signal ($V_1$). The second intermediate transistor 320 has a gate terminal connected to the gate terminal of the first intermediate transistor 318 for receiving the first input data signal ($V_1$) and a drain terminal connected to a drain terminal of the first intermediate transistor 318 for outputting the inverted first input data signal ($\overline{V_1}$). A source terminal of the second intermediate transistor 320 is an enable terminal of the first intermediate driver circuit 302 that enables the first intermediate driver circuit 302 to output the inverted first input data signal ($\overline{V_1}$).

The first transistor 306 has a drain terminal connected to the enable terminal of the first intermediate driver circuit 302, a source terminal connected to ground, and a gate terminal for receiving the first input clock signal (clk1). The first intermediate driver circuit 302 outputs the inverted first input data signal ($\overline{V_1}$) when the first input clock signal (clk1) is activated.

The second transistor 308 has a drain terminal connected to the enable terminal of the first intermediate driver circuit 302, a source terminal connected to ground, and a gate terminal for receiving the asynchronous enable signal (ASYNC). The first intermediate driver circuit 302 outputs the inverted first input data signal ($\overline{V_1}$) when the asynchronous enable signal (ASYNC) is activated. Thus, each of the first and second transistors 306 and 308 enables the first intermediate driver circuit 302 to output the inverted first input data signal ($\overline{V_1}$). During synchronous mode of operation, the system 100 serializes the first through eighth input data signals ($V_1$-$V_8$) based on the first through fourth input clock signals (clk1-clk4), the first and second intermediate clock signals (Iclk1 and Iclk2), and the first and second output clock signals (Oclk1 and Oclk2). The first and second latches 202 and 204 output the respective intermediate output data signals based on the corresponding clock signals. However, during the asynchronous mode of operation, the system 100 does not receive the first through fourth input clock signals (clk1-clk4), the first and second intermediate clock signals (Iclk1 and Iclk2), and the first and second output clock signals (Oclk1 and Oclk2). Thus, in the asynchronous mode of operation, the first and second latches 202 and 204 output the respective intermediate output data signals based on a logic state of the asynchronous enable signal (ASYNC).

The first cross-coupled latch circuit 314 includes first and second inverters 326 and 328 cross couple connected to each other. The first inverter 326 generates the first input data signal ($V_1$) and the second inverter 328 generates the inverted first input data signal ($\overline{V_1}$). The first cross-coupled latch circuit 314 latches the inverted first input data signal ($\overline{V_1}$) when the first input clock signal (clk1) is activated.

The first inverter 326 includes first and second inverter transistors 330 and 332. The first inverter transistor 330 has a gate terminal connected to the drain terminal of the first intermediate transistor 318, and a source terminal connected to the supply voltage ($V_{DD}$). The second inverter transistor 332 has a gate terminal connected to the gate terminal of the first inverter transistor 330, a drain terminal connected to a drain terminal of the first inverter transistor 330, and a source terminal connected to ground.

The second inverter 328 includes third and fourth inverter transistors 334 and 336. The third inverter transistor 334 has a gate terminal connected to the drain terminal of the first inverter transistor 330, and a source terminal connected to the supply voltage ($V_{DD}$). The fourth inverter transistor 336 has a gate terminal connected to the gate terminal of the third inverter transistor 334, a drain terminal connected to a drain terminal of the third inverter transistor 334, and a source terminal connected to ground.

The second intermediate driver circuit 304 has an input terminal connected to the output terminal of the first intermediate driver circuit 302 for receiving the inverted first input data signal ($\overline{V_1}$), and an output terminal for generating the first intermediate signal ($V_{INT1}$). The third intermediate transistor 322 has a source terminal connected to the supply voltage ($V_{DD}$) and a gate terminal connected to the output terminal of the first intermediate driver circuit 302 for receiving the inverted first input data signal ($\overline{V_1}$). The fourth intermediate transistor 324 has a gate terminal connected to the gate terminal of the third intermediate transistor 322 for receiving the inverted first input data signal ($\overline{V_1}$) and a drain terminal connected to a drain terminal of the third intermediate transistor 322 for outputting the first intermediate signal ($V_{INT1}$). A source terminal of the fourth intermediate transistor 324 is an enable terminal of the second intermediate driver circuit 304 that enables the second intermediate driver circuit 304 to output the first intermediate signal ($V_{INT1}$).

The third transistor 310 has a drain terminal connected to the enable terminal of the second intermediate driver circuit 304, a source terminal connected to ground, and a gate terminal for receiving the first input clock signal (clk1). The second intermediate driver circuit 304 outputs the first intermediate signal ($V_{INT1}$) when the first input clock signal (clk1) is activated.

The fourth transistor 312 has a drain terminal connected to the enable terminal of the second intermediate driver circuit 304, a source terminal connected to ground, and a gate terminal for receiving the asynchronous enable signal (ASYNC). The second intermediate driver circuit 304 outputs the first intermediate signal ($V_{INT1}$) when the asynchronous enable signal (ASYNC) is activated. Thus, each of the third and fourth transistors 310 and 312 enables the second intermediate driver circuit 304 to output the first intermediate signal ($V_{INT1}$). During the asynchronous mode of operation, the second intermediate driver circuit 304 outputs the first intermediate signal ($V_{INT1}$) based on the logic state of the asynchronous enable signal (ASYNC).

The second cross-coupled latch circuit 316 includes third and fourth inverters 338 and 340 cross couple connected to each other. The third inverter 338 generates an inverted first intermediate signal ($\overline{V_{INT1}}$) and the fourth inverter 340 generates the first intermediate signal ($V_{INT1}$).

The third inverter 338 includes fifth and sixth inverter transistors 342 and 344. The fifth inverter transistor 342 has a gate terminal connected to the drain terminal of the third intermediate transistor 322 and a source terminal connected to the supply voltage ($V_{DD}$). The sixth inverter transistor 344 has a gate terminal connected to the gate terminal of the fifth inverter transistor 342, a drain terminal connected to a drain terminal of the fifth inverter transistor 342, and a source terminal connected to ground.

The fourth inverter 340 includes seventh and eighth inverter transistors 346 and 348. The seventh inverter transistor 346 has a gate terminal connected to the drain terminal of the fifth inverter transistor 342 and a source terminal connected to the supply voltage ($V_{DD}$). The eighth inverter transistor 348 has a gate terminal connected to the gate terminal of the seventh inverter transistor 346, a drain terminal connected to a drain terminal of the seventh inverter transistor 346, and a source terminal connected to ground.

Figure 4A:
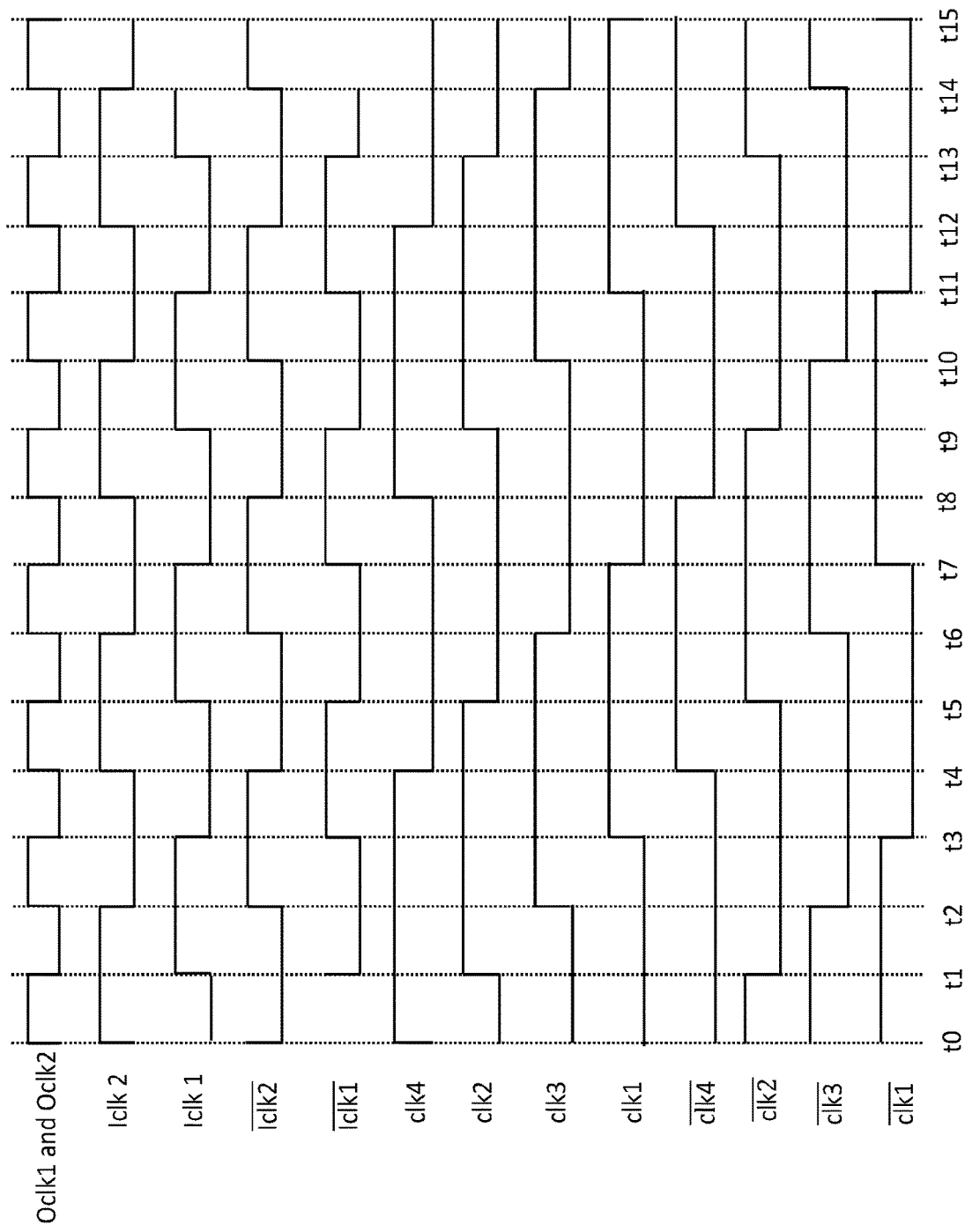
FIGS. 4A and 4B are timing diagrams illustrating various signals of the system of FIG. 1 in accordance with an embodiment of the present invention.
Figure 4B:
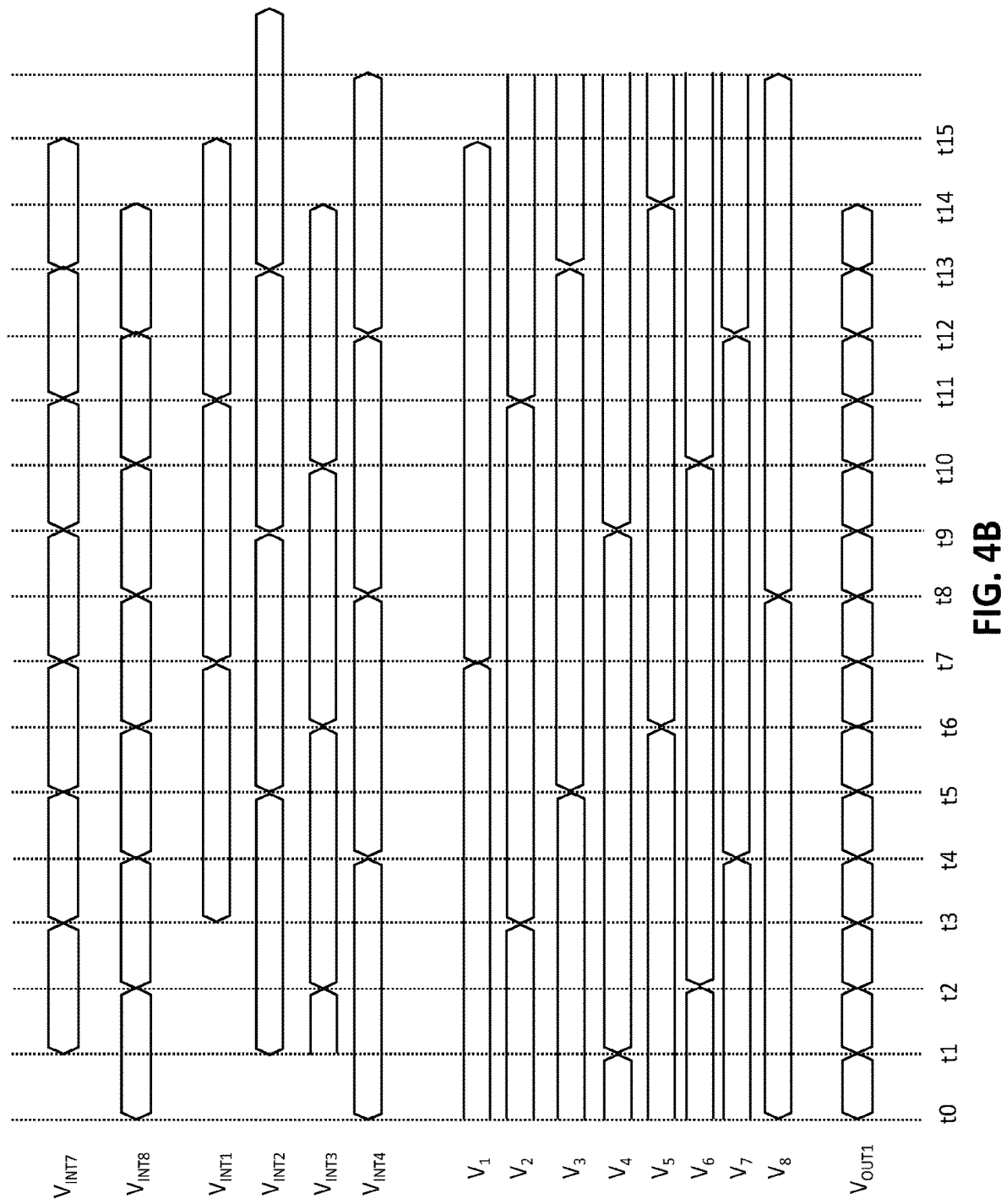

Referring now to FIGS. 4A and 4B, a timing diagram illustrating the first through fourth input clock signals (clk1-clk4), the inverted first through fourth input clock signals ($\overline{clk1}$-$\overline{clk4}$), the first and second intermediate clock signals (Iclk1 and Iclk2), the inverted first and second intermediate clock signals ($\overline{Iclk1}$ and $\overline{Iclk2}$), the first and second output clock signals (Oclk1 and Oclk2), the first through fourth, seventh, and eighth intermediate signals ($V_{INT1}$-$V_{INT4}$, $V_{INT7}$, and $V_{INT8}$), the first through eighth input data signals ($V_1$-$V_8$), and the first output data signal ($V_{OUT1}$) of the system 100 in accordance with an embodiment of the present invention is shown.

In an example, as illustrated in FIG. 3, the first output clock signal (Oclk1) is a half-rate clock signal. Hence, the first output serializer circuit 110 outputs the seventh intermediate signal ($V_{INT7}$) as the first serialized signal ($V_{S1}$) at the rising edge of the first output clock signal (Oclk1), and the first output serializer circuit 110 outputs the eighth intermediate signal ($V_{INT8}$) as the first serialized signal ($V_{S1}$) at the falling edge of the first output clock signal (Oclk1). Further, frequencies of the first and second intermediate clock signals (Iclk1 and Iclk2) are half a frequency of the first output clock signal (Oclk1). Further, the first through fourth input clock signals (clk1-clk4) have frequencies equal to half a frequency of the first intermediate clock signal (Iclk1).

The first input clock signal (clk1) and the inverted first input clock signal ($\overline{clk1}$) have a phase difference of 180 degrees between them. Similarly, each of the second input clock signal (clk2) and the inverted second input clock signal ($\overline{clk2}$), the third input clock signal (clk3) and the inverted third input clock signal ($\overline{clk3}$), and the fourth input clock signal (clk4) and the inverted fourth input clock signal ($\overline{clk4}$) have a phase difference of 180 degrees between them. Similarly, the first and second intermediate clock signals (Iclk1 and Iclk2) and the inverted first and second intermediate clock signals ($\overline{Iclk1}$ and $\overline{Iclk2}$) have a phase difference of 180 degrees between them, respectively. Thus, when the first through fourth input clock signals (clk1-clk4) are activated, the inverted first through fourth input clock signals ($\overline{clk1}$-$\overline{clk4}$) are deactivated, respectively. Similarly, when the first and second intermediate clock signals (Iclk1 and Iclk2) are activated, the inverted first and second intermediate clock signals ($\overline{\text{Iclk1}}$-$\overline{\text{Iclk2}}$) are deactivated. The first and second input clock signals (clk1 and clk2) have a predetermined phase difference of 90 degrees between them. Similarly, the third and fourth input clock signals (clk3 and clk4) have a predetermined phase difference of 90 degrees between them. Further, the first and third input clock signals (clk1 and clk3) have a predetermined phase difference of 45 degrees between them, and the second and fourth input clock signals (clk2 and clk4) have a predetermined phase difference of 45 degrees between them. Since the serializer circuit 103 operates in the synchronous mode, the external select signal (EXTSEL) is activated.

In operation, at time t0, the fourth input clock signal (clk4), the inverted first through third input clock signals ($\overline{\text{clk1}}$-$\overline{\text{clk3}}$), the second intermediate clock signal (Iclk2), and the first and second output clock signals (Oclk1 and Oclk2) are activated. The FIFO memory 102 outputs the eighth input data signal ($V_8$). The fourth input serializer circuit 118d receives the eighth input data signal ($V_8$) and provides the eighth input data signal ($V_8$) as the fourth intermediate signal ($V_{INT4}$). The second intermediate serializer circuit 120b receives the fourth intermediate signal ($V_{INT4}$) and provides the fourth intermediate signal ($V_{INT4}$) as the sixth intermediate signal ($V_{INT6}$), thereby forwarding the eighth input data signal ($V_8$) to the first output serializer circuit 110 by way of the tri-state circuit 108. The first output serializer circuit 110 receives the sixth intermediate signal ($V_{INT6}$) as the eighth intermediate signal ($V_{INT8}$) and provides the eighth intermediate signal ($V_{INT8}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the eighth input data signal ($V_8$).

At time t1, the second and fourth input clock signals (clk2 and clk4), the inverted first and third input clock signals ($\overline{\text{clk1}}$) and ($\overline{\text{clk3}}$), and the first and second intermediate clock signals (Iclk1 and Iclk2) are activated. The FIFO memory 102 provides the fourth input data signal ($V_4$). The second input serializer circuit 118b provides the fourth input data signal ($V_4$) as the second intermediate signal ($V_{INT2}$) and the fourth input serializer circuit 118d provides the eighth input data signal ($V_8$) as the fourth intermediate signal ($V_{INT4}$). The first intermediate serializer circuit 120a receives the second intermediate signal ($V_{INT2}$) and provides the second intermediate signal ($V_{INT2}$) as the fifth intermediate signal ($V_{INT5}$), thereby forwarding the fourth input data signal ($V_4$) to the first output serializer circuit 110 by way of the tri-state circuit 108. The second intermediate serializer circuit 120b receives the fourth intermediate signal ($V_{INT4}$) and provides the fourth intermediate signal ($V_{INT4}$) as the sixth intermediate signal ($V_{INT6}$), thereby forwarding the eighth input data signal ($V_8$) to the first output serializer circuit 110. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively, and provides the seventh intermediate signal ($V_{INT7}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the fourth input data signal ($V_4$).

At time t2, the second through fourth input clock signals (clk2-clk4), the inverted first input clock signal ($\overline{\text{clk1}}$), the first intermediate clock signal (Iclk1), and the first and second output clock signals (Oclk1 and Oclk2), are activated. The FIFO memory 102 provides the sixth input data signal ($V_6$). The second input serializer circuit 118b outputs the fourth input data signal ($V_4$) as the second intermediate signal ($V_{INT2}$), the third input serializer circuit 118c provides the sixth input data signal ($V_6$) as the third intermediate signal ($V_{INT3}$), and the fourth input serializer circuit 118d provides the eighth input data signal ($V_8$) as the fourth intermediate signal ($V_{INT4}$). The first intermediate serializer circuit 120a provides the second intermediate signal ($V_{INT2}$) as the fifth intermediate signal ($V_{INT5}$), thereby forwarding the fourth input data signal ($V_4$) to the first output serializer circuit 110. The second intermediate serializer circuit 120b provides the third intermediate signal ($V_{INT3}$) as the sixth intermediate signal ($V_{INT6}$), thereby forwarding the sixth input data signal ($V_6$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively and provides the eighth intermediate signal ($V_{INT8}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the sixth input data signal ($V_6$).

At time t3, the first through fourth input clock signals (clk1-clk4) are activated. The FIFO memory 102 provides the second input data signal ($V_2$). The first input serializer circuit 118a outputs the second input data signal ($V_2$) as the first intermediate signal ($V_{INT1}$), the second input serializer circuit 118b outputs the fourth input data signal ($V_4$) as the second intermediate signal ($V_{INT2}$), the third input serializer circuit 118c provides the sixth input data signal ($V_6$) as the third intermediate signal ($V_{INT3}$), and the fourth input serializer circuit 118d provides the eighth input data signal ($V_8$) as the fourth intermediate signal ($V_{INT4}$). The first intermediate serializer circuit 120a provides the first intermediate signal ($V_{INT1}$) as the fifth intermediate signal ($V_{INT1}$), thereby forwarding the second input data signal ($V_2$) to the first output serializer circuit 110. The second intermediate serializer circuit 120b provides the third intermediate signal ($V_{INT3}$) as the sixth intermediate signal ($V_{INT6}$), thereby forwarding the sixth input data signal ($V_6$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively, and provides the seventh intermediate signal ($V_{INT7}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the second input data signal ($V_2$).

At time t4, the first through third input clock signals (clk1-clk3), the inverted fourth input clock signal ($\overline{\text{clk4}}$), the second intermediate clock signal (Iclk2), and the first and second output clock signals (Oclk1 and Oclk2) are activated. The first input serializer circuit 118a outputs the second input data signal ($V_2$) as the first intermediate signal ($V_{INT1}$), the second input serializer circuit 118b outputs the fourth input data signal ($V_4$) as the second intermediate signal ($V_{INT2}$), the third input serializer circuit 118c provides the sixth input data signal ($V_6$) as the third intermediate signal ($V_{INT4}$), and the fourth input serializer circuit 118d provides the seventh input data signal ($V_7$) as the fourth intermediate signal ($V_{INT4}$). The first intermediate serializer circuit 120a provides the first intermediate signal ($V_{INT1}$) as the fifth intermediate signal ($V_{INT5}$), thereby forwarding the second input data signal ($V_2$) to the tri-state circuit 108. The second intermediate serializer circuit 120b provides the fourth intermediate signal ($V_{INT4}$) as the sixth intermediate signal ($V_{INT6}$), thereby forwarding the seventh input data signal ($V_7$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively and provides the eighth intermediate signal ($V_{INT8}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting seventh input data signal ($V_7$).

At time t5, the first and third input clock signals (clk1 and clk3), the inverted second and fourth input clock signals ($\overline{clk2}$ and $\overline{clk4}$), and the first and second intermediate clock signals (Iclk1 and Iclk2) are activated. The FIFO memory 102 outputs the third input data signal ($V_3$). The first input serializer circuit 118a outputs the second input data signal ($V_2$) as the first intermediate signal ($V_{INT1}$), the second input serializer circuit 118b outputs the third input data signal ($V_3$) as the second intermediate signal ($V_{INT2}$), the third input serializer circuit 118c outputs the sixth input data signal ($V_6$) as the third intermediate signal ($V_{INT3}$), and the fourth input serializer circuit 118d outputs the seventh input data signal ($V_7$) as the fourth intermediate signal ($V_{INT4}$). The first intermediate serializer circuit 120a provides the second intermediate signal ($V_{INT2}$) as the fifth intermediate signal ($V_{INT1}$), thereby forwarding the third input data signal ($V_3$) to the first output serializer circuit 110 by way of the tri-state circuit 108. The second intermediate serializer circuit 120b provides the fourth intermediate signal ($V_{INT4}$) as the sixth intermediate signal ($V_{INT6}$), thereby forwarding the seventh input data signal ($V_7$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively, and provides the seventh intermediate signal ($V_{INT7}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the third input data signal ($V_3$).

At time t6, the first input clock signal (clk1), the inverted second through fourth input clock signals ($\overline{clk2}$-$\overline{clk4}$), and the first intermediate clock signal (Iclk1) are activated. The FIFO memory 102 outputs the fifth input data signal ($V_5$). The first input serializer circuit 118a outputs the second input data signal ($V_2$) as the first intermediate signal ($V_{INT1}$), the second input serializer circuit 118b outputs the third input data signal ($V_3$) as the second intermediate signal ($V_{INT2}$), the third input serializer circuit 118c outputs the fifth input data signal ($V_5$) as the third intermediate signal ($V_{INT3}$), and the fourth input serializer circuit 118d outputs the seventh input data signal ($V_7$) as the fourth intermediate signal ($V_{INT4}$). The first intermediate serializer circuit 120a provides the second intermediate signal ($V_{INT2}$) as the fifth intermediate signal ($V_{INT5}$), thereby forwarding the third input data signal ($V_3$) to the first output serializer circuit 110 by way of the tri-state circuit 108. The second intermediate serializer circuit 120b provides the third intermediate signal ($V_{INT3}$) as the sixth intermediate signal ($V_{INT6}$), thereby forwarding the fifth input data signal ($V_5$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively, and provides the eighth intermediate signal ($V_{INT8}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the fifth input data signal ($V_5$).

At time t7, the inverted first through fourth input clock signals ($\overline{clk1}$-$\overline{clk4}$) are activated. The FIFO memory 102 outputs the first input data signal ($V_1$). The first input serializer circuit 118a outputs the first input data signal ($V_1$) as the first intermediate signal ($V_{INT1}$), the second input serializer circuit 118b outputs the third input data signal ($V_3$) as the second intermediate signal ($V_{INT2}$), the third input serializer circuit 118c outputs the fifth input data signal ($V_5$) as the third intermediate signal ($V_{INT3}$), and the fourth input serializer circuit 118d outputs the seventh input data signal ($V_7$) as the fourth intermediate signal ($V_{INT4}$). The first intermediate serializer circuit 120a provides the first intermediate signal ($V_{INT1}$) as the fifth intermediate signal ($V_{INT5}$), thereby forwarding the first input data signal ($V_1$) to the first output serializer circuit 110 by way of the tri-state circuit 108. The second intermediate serializer circuit 120b provides the third intermediate signal ($V_{INT3}$) as the sixth intermediate signal ($V_{INT6}$), thereby forwarding the fifth input data signal ($V_5$) to the first output serializer circuit 110 by way of the tri-state circuit 108. The first output serializer circuit 110 receives the fifth and sixth intermediate signals ($V_{INT5}$ and $V_{INT6}$) as the seventh and eighth intermediate signals ($V_{INT7}$ and $V_{INT8}$), respectively and provides the seventh intermediate signal ($V_{INT7}$) as the first serialized signal ($V_{S1}$). When the first enable signal (En1) is activated, the first driver circuit 114 provides the first serialized signal ($V_{S1}$) as the first output data signal ($V_{OUT1}$), thereby outputting the first input data signal ($V_1$).

During tri-state mode of operation, each of the first and second enable signals (En1 and En2) is deactivated. For the system 100 to operate in tri-state mode, the first and second serialized signals ($V_{S1}$ and $V_{S2}$) should be at high logic state. Thus, the first serialized signal ($V_{S1}$), the external signal ($V_{EXT}$) and the external select signal (EXTSEL) are at the second logic state during the tri-state mode of operation. The external signal ($V_{EXT}$) overrides the fifth and sixth intermediate signals ($V_{INT5}$ and $V_{INT6}$) by activating the external select signal (EXTSEL). Similarly, when the second serialized signal ($V_{S2}$), the external signal ($V_{EXT}$) and the external select signal (EXTSEL) are at the second logic state, the second driver circuit 116 outputs the second output data signal ($V_{OUT2}$) at a high impedance state.

During pull-up mode, the first and second output data signals ($V_{OUT1}$ and $V_{OUT2}$) are pulled-up to a high logic state. The first output data signal ($V_{OUT1}$) is at the second logic state when the first enable signal (En1) is deactivated, the first serialized signal ($V_{S1}$) and the external signal ($V_{EXT}$) is at the first logic state, and the external select signal (EXTSEL) is at the second logic state. Similarly, the second output data signal ($V_{OUT2}$) is at the second logic state, when the second enable signal (En2) is deactivated, the second serialized signal ($V_{S2}$) and the external signal ($V_{EXT}$) is at the first logic state, and the external select signal (EXTSEL) is at the second logic state.

Since, each serializer circuit receives a clock signal and an inverted version of the clock signal, the critical path of each serializer circuit is a full clock cycle. Thus, for serializing high speed input data signals, the serializer circuit 103 provides a correct measure of the input data signals which is transmitted to the wireline. The first through fourth input clock signals (clk1 and clk4), the first and second intermediate clock signals (Iclk1 and Iclk2) and the first output clock signal (Oclk1) are activated and deactivated in a sequence which ensures that the input data signal launched by the FIFO memory 102 is outputted as the first output data signal ($V_{OUT1}$) of the system 100. Since, the input serializer circuit 104 receives the first through eighth input data signals ($V_1$-$V_8$) at multiple phases of a clock signal (i.e., the first through fourth input clock signals (clk1 and clk4) and the inverted first through fourth input clock signals ($\overline{clk1}$-$\overline{clk4}$)), the first through eighth input data signals ($V_1$-$V_8$) are not delayed by the input serializer circuit 104 in excess of what is required for the serialization. The multiple phases of the clock signal ensures that an input data signal which is launched by the FIFO memory 102 is received by the input serializer circuit 104, and is relayed through the intermediate serializer circuit 106, the tri-state circuit 108, and the first and second output serializer circuits 110 and 112 without a delay in excess of what is required for the serialization. Thus, 2:1 serializer circuits used in the system 100 that receive corresponding first and second data signals and a clock signal ensure that the second input data signal of each 2:1 serializer circuit is not halted for half cycle of the corresponding clock signal. Further, each 2:1 serializer circuit ensures that the corresponding first and second input data signals are outputted successively. It will be understood by those with skill in the art that the system 100 is not restricted to the 4:1 and 8:1 serializer circuits. The system 100 may be implemented as an N:1 serializer circuit, where 'N' is an integer.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A system for serializing data signals comprising:
   a first-in-first-out (FIFO) memory configured to launch a plurality of input data signals, each input data signal launched based on a respective clock signal of a plurality of clock signals, wherein at least four phase differences exist among the plurality of clock signals;
   a plurality of input serializer circuits, each input serializer circuit configured to:
      receive two input data signals of the plurality of input data signals;
      receive two clock signals of the plurality of clock signals, the two clock signals having launched the two input data signals, wherein a time between when the two input data signals are received is based on a phase difference between the two clock signals of the at least four phase differences among the plurality of clock signals; and
      serialize the two received input data signals to generate a serialized signal; and
   a tri-state circuit configured to implement differential signaling based on intermediate serialized signals input to the tri-state circuit, each intermediate serialized signal generated by serializing two of the serialized signals.

2. The system of claim 1, further comprising a clock generator configured to generate the plurality of clock signals, each clock signal offset in phase from at least one other clock signal of the plurality of clock signals.

3. The system of claim 1, wherein each of the plurality of input serializer circuits has a critical path, a length of the critical path equal to a full clock cycle of the plurality of clock signals.

4. The system of claim 1, wherein the two input clock signals received by one of the plurality of input serializer circuits are activated and deactivated in a sequence, wherein the sequence causes an order of the serialized signals to match an order in which the input data signals are received by one of the plurality of input serializer circuits.

5. The system of claim 1, wherein the system further comprises a plurality of intermediate serializer circuits, each intermediate serializer circuit of the plurality of intermediate serializer circuits configured to:
   receive two serialized signals from two of the plurality of input serializer circuits;
   receive two intermediate clock signals, the two intermediate clock signals transitioning at twice a frequency of the plurality of clock signals received by the plurality of input serializer circuits; and
   serialize the two received serialized signals.

6. The system of claim 1, wherein the tri-state circuit comprises:
   a plurality of intermediate inverters, each of the plurality of intermediate inverters configured to receive a serialized signal from one of the plurality of intermediate serializer circuits and invert the serialized signal received from the one of the plurality of intermediate serializer circuits; and
   a plurality of multiplexers, each multiplexer configured to:
      receive a serialized signal from one of the plurality of intermediate serializer circuits,
      receive an external signal,
      receive an external select signal, and
      output one of the serialized signals received from one of the plurality of intermediate serializer circuits or the external signal based on the external select signal.

7. The system of claim 1, further comprising:
   an output serializer circuit configured to:
      receive two intermediate signals from the tri-state circuit,
      receive an output clock signal, and
      output an output serialized signal based on the two intermediate signals and the output clock signal; and
   a driver circuit configured to:
      receive the output serialized signal from the output serializer circuit,
      receive an enable signal, and
      generate an output signal based on the output serialized signal and the enable signal.

8. The system of claim 1, wherein the system is configured to operate in an asynchronous mode of operation wherein each of the plurality of input serializer circuits receives an asynchronous enable signal and serializes the two received data signals responsive to the asynchronous enable signal.

9. The system of claim 1, wherein the two received clock signals of the plurality of clock signals comprise a first clock signal and a second clock signal, wherein the second clock signal comprises an inverted version of the first clock signal.

10. The system of claim 1, wherein each input serializer circuit comprises a multiplexer and two latches, wherein each of the two latches receives a respective one of the two received clock signals and a respective one of the two received input data signals.

11. The system of claim 7, wherein each of the two intermediate signals received from the tri-state circuit is an inverted version of a serialized signal received from one of the plurality of intermediate serializer circuit.

12. The system of claim 7, wherein the output signal generated by the driver circuit is at a high impedance state when the enable signal is deactivated.

13. The system of claim 7, wherein the two intermediate signals comprise a first intermediate signal and a second intermediate signal, the output serialized signal is the first intermediate signal when the output clock signal is activated, and the output serialized signal is the second intermediate signal when the output clock signal is deactivated.

14. A non-transitory computer readable medium storing a digital representation of a serializer circuit, the serializer circuit comprising:
 a first-in-first-out (FIFO) memory configured to launch a plurality of input data signals, each input data signal launched based on a respective clock signal of a plurality of clock signals, wherein at least four phase differences exist among the plurality of clock signals;
 a plurality of input serializer circuits, each input serializer circuit configured to:
  receive two input data signals of the plurality of input data signals;
  receive two clock signals of the plurality of clock signals, the two clock signals having launched the two input data signals, wherein a time between when the two input data signals are received is based on a phase difference between the two clock signals of the at least four phase differences among the plurality of clock signals; and
  serialize the two received input data signals to generate a serialized signal; and
 a tri-state circuit configured to implement differential signaling based on intermediate serialized signals input to the tri-state circuit, each intermediate serialized signal generated by serializing two of the serialized signals.

15. The non-transitory computer readable medium of claim 14, wherein the serializer circuit further comprises a clock generator configured to generate the plurality of clock signals, each clock signal offset in phase from at least one other clock signal of the plurality of clock signals.

16. The non-transitory computer readable medium of claim 14, wherein each of the plurality of input serializer circuits has a critical path, a length of the critical path equal to a full clock cycle of the plurality of clock signals.

17. The non-transitory computer readable medium of claim 14, wherein the two input clock signals received by one of the plurality of input serializer circuits are activated and deactivated in a sequence, wherein the sequence causes an order of the serialized signals to match an order in which the input data signals are received by one of the plurality of input serializer circuits.

18. The non-transitory computer readable medium of claim 14, wherein the serializer circuit is configured to operate in an asynchronous mode of operation wherein each of the plurality of input serializer circuits receives an asynchronous enable signal and serializes the two received data signals responsive to the asynchronous enable signal.

19. A system for serializing data signals comprising:
 a first-in-first-out (FIFO) memory configured to launch a plurality of input data signals, each input data signal launched based on a respective clock signal of a plurality of clock signals;
 a plurality of input serializer circuits, each input serializer circuit configured to:
  receive two input data signals of the plurality of input data signals;
  receive two clock signals of the plurality of clock signals, the two clock signals having launched the two input data signals; and
  serialize the two received input data signals to generate a serialized signal; and
 a plurality of intermediate serializer circuits, each intermediate serializer circuit of the plurality of intermediate serializer circuits configured to:
  receive two serialized signals from two of the plurality of input serializer circuits;
  receive two intermediate clock signals, the two intermediate clock signals transitioning at twice a frequency of the plurality of clock signals received by the plurality of input serializer circuits; and
  serialize the two received serialized signals.

* * * * *